United States Patent
Peng et al.

(10) Patent No.: US 8,570,722 B2
(45) Date of Patent: Oct. 29, 2013

(54) ELECTRONIC DEVICE WITH MULTIPLE POWER PORTS

(75) Inventors: Wen-Tang Peng, New Taipei (TW); Guang-Yi Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 186 days.

(21) Appl. No.: 13/178,519

(22) Filed: Jul. 8, 2011

(65) Prior Publication Data

US 2012/0218689 A1     Aug. 30, 2012

(51) Int. Cl.
*G06F 1/16* (2006.01)

(52) U.S. Cl.
USPC ....... 361/679.04; 439/668; 312/247; 455/269

(58) Field of Classification Search
USPC ........... 345/1.3, 173, 131, 158; 439/501, 350, 439/345, 628, 540.1, 137, 668; 312/7.2, 312/112, 219, 221, 348.4, 330.1, 348.1, 312/111, 319.4, 107.5, 247; 455/150.1, 455/269, 343.1, 11.1, 414.4; 248/220.22, 248/228.11, 309.1, 349.1, 454; 320/109; 361/679.01, 679.21, 679.27, 679.3, 361/679.24, 679.08, 679.06, 679.22, 361/679.48, 679.52, 679.53, 679.33, 361/679.55, 679.04, 679.47
See application file for complete search history.

(56) References Cited

U.S. PATENT DOCUMENTS

| | | | |
|---|---|---|---|
| 2012/0064759 A1* | 3/2012 | Liu et al. | 439/501 |
| 2012/0091961 A1* | 4/2012 | Hani et al. | 320/109 |
| 2012/0118327 A1* | 5/2012 | Mazmanyan | 134/21 |

* cited by examiner

*Primary Examiner* — Hung Duong
(74) *Attorney, Agent, or Firm* — Altis & Wispro Law Group, Inc.

(57) ABSTRACT

An electronic device includes a case and a power supply arranged in the case. The power supply includes a first power port to connect to a power line for supplying power to the electronic device. The electronic device further includes an extension cord to connect to the first power port through a plug; the extension cord includes a second power port to connect to the power line. When the plug is connected with the first power port, the power line is connected to the second power port to supply power to the electronic device through the second power port, the extension cord, the first power port, and the power supply; when the plug is disconnected from the first power port, the power line is connected to the first power port to supply power to the electronic device through the first power port and the power supply.

10 Claims, 3 Drawing Sheets

ELECTRONIC DEVICE WITH MULTIPLE POWER PORTS

BACKGROUND

1. Technical Field

The present disclosure relates to electronic devices, and particularly, to an electronic device with multiple power ports.

2. Description of Related Art

A server usually has a power port on a rear panel of the server to connect to a power source. However, the power port on the rear panel is hard to access while operating or maintaining the server.

Therefore, what is needed is an electronic device to overcome the problems mentioned above.

BRIEF DESCRIPTION OF THE DRAWINGS

The components in the drawings are not necessarily drawn to scale, the emphasis instead being placed upon clearly illustrating the principles of an electronic device with multiple power ports. Moreover, in the drawings, like reference numerals designate corresponding parts throughout the several views.

DETAILED DESCRIPTION

Figure 1:
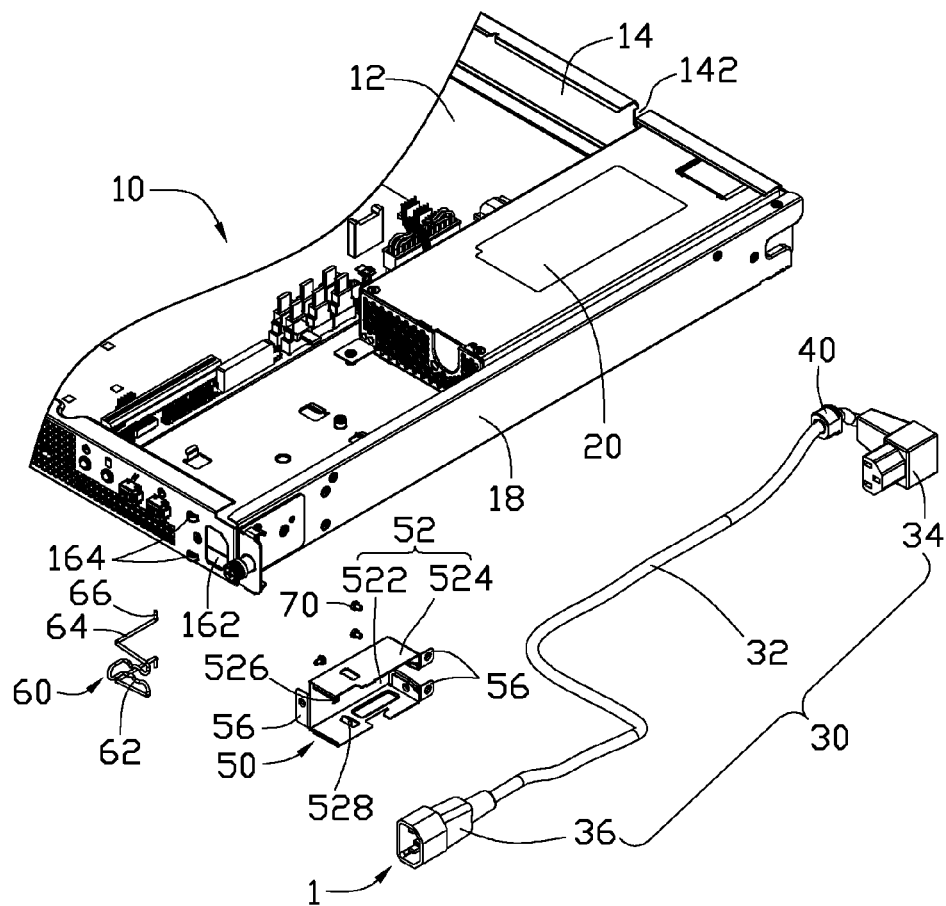
FIG. 1 is an partial, isometric, exploded view of an electronic device in accordance with an exemplary embodiment.
Figure 2:
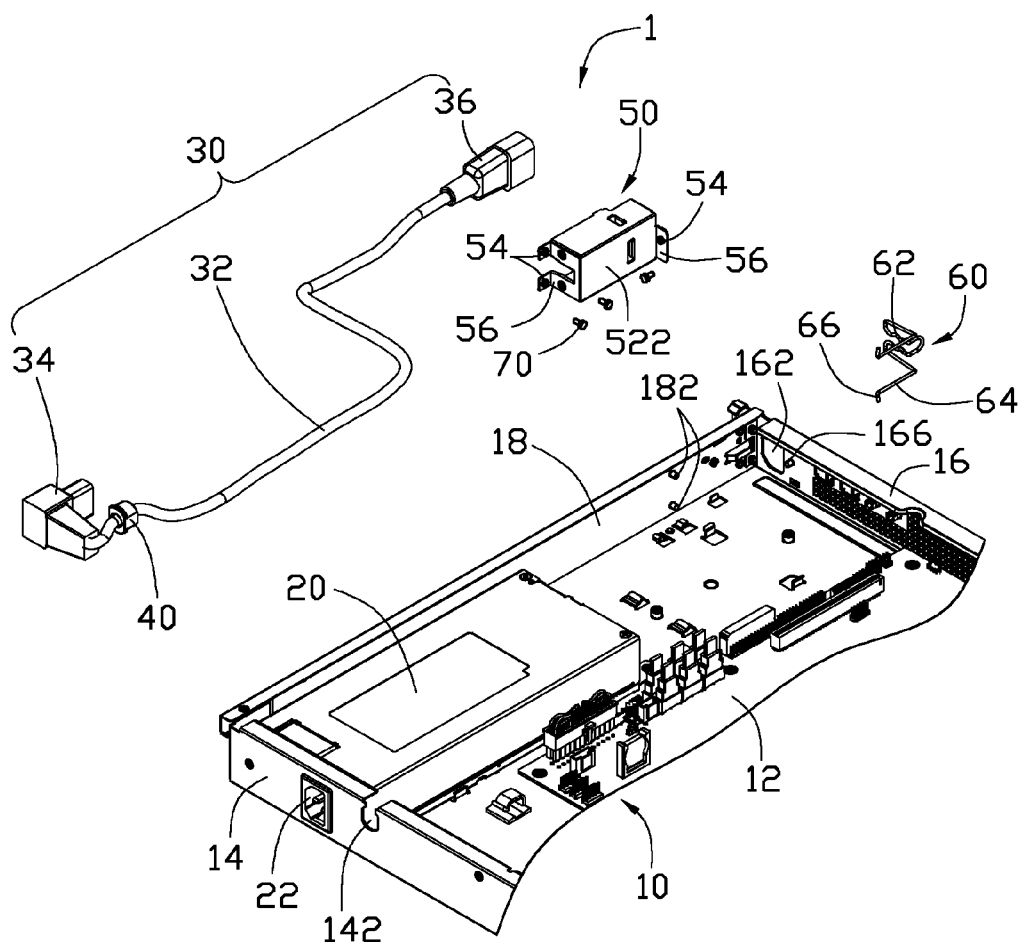
FIG. 2 is an isometric, exploded view of another aspect of the electronic device of FIG. 1.

Referring to FIG. 1-2, an electronic device 1 includes a case 10, a power supply 20, an extension cord 30, a holder 50, and a clamp 60.

In the present embodiment, the electronic device 1 is a server. The case 10 is made of electromagnetic shielding materials, includes a bottom plate 12, a first side plate 14, a second side plate 16, and a third side plate 18. The power supply 20 is mounted in an intersection of the bottom plate 12, the first side plate 14 and the third side plate 18. On the first side plate 14, a hole 142 is defined near the power supply 20 for anchoring a wire saddle 40 to hold the extension cord 30. On the second side plate 16, an opening 162 is defined near the third side plate 18; a mounting hole 166 is defined on an inner side of the second side plate 16 near the opening 162, and two clasps 164 are arranged on an outer side of the second side plate 16 near the opening 162. Two mounting holes 182 are defined on an inner side of the third side plate 18 near the second side plate 16.

The power supply 20 includes a first power port 22 accessible from an outer side of the first side plate 14. The extension cord 30 includes a power cord 32 penetrating the wire saddle 40, and a plug 34 and a second power port 36 are arranged respectively on two ends of the power cord 32.

The holder 50 is made of electromagnetic shielding materials, and includes a shell 52 for receiving the second power port 36; the shell 52 is bent to form lock pieces 56 having locking holes 54 therein. The shell 52 further includes a base plate 522 and two side plates 524 bended from the base plate 522 on the same side. A first snapping tab 526 is arranged on an inner side of the base plate 522 to clip the second power port 36, and second snapping tab 528 is arranged on an inner side of the side plates 524 to clip the second power port 36.

In the present embodiment, the clamp 60 is bent from a metal wire and includes a clamp section 62, with two elastic arms 64 extending from the clamp section 62, and two hooks 66 hooking to the clasps 164.

Figure 3:
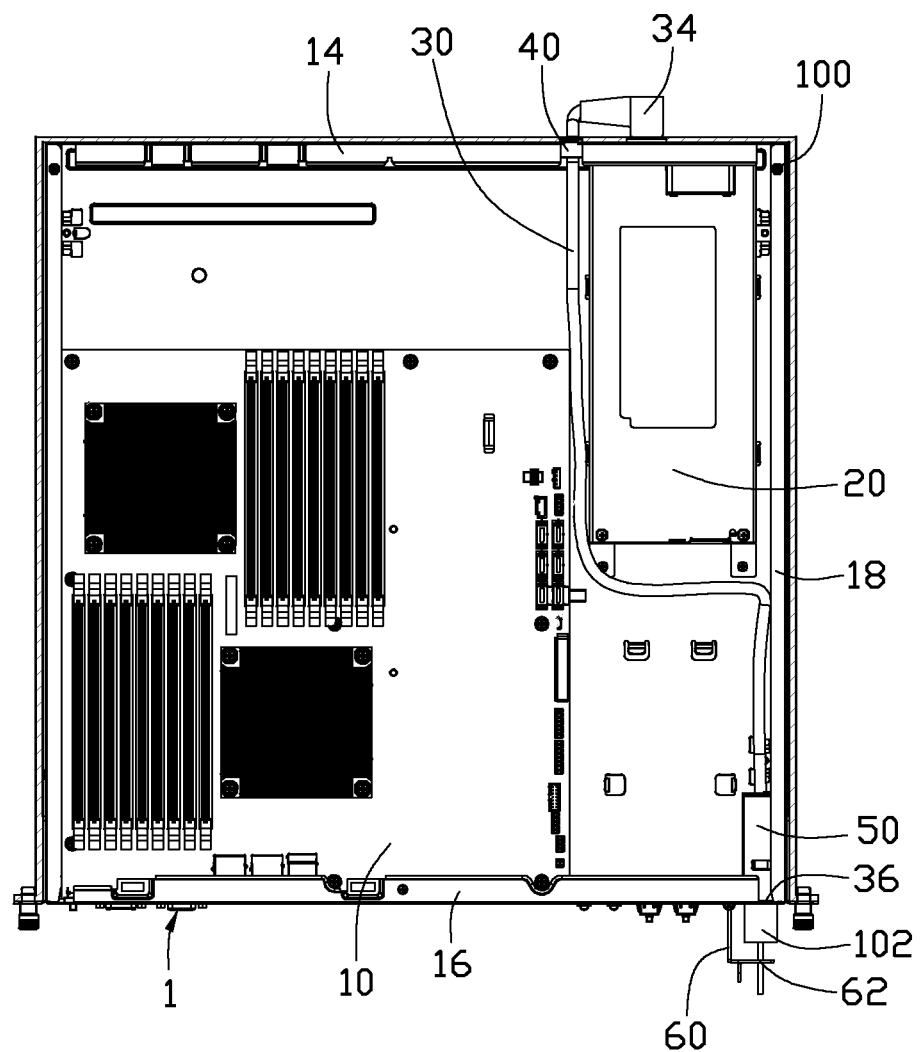
FIG. 3 is a top view of the electronic device of FIG. 1.

Referring to FIG. 3, the electronic device 1 is installed in a rack 100 when assembled; the extension cord 30 is arranged in the case 10, and the wire saddle 40 is clipped to the hole 142. The plug 34 can connect or disconnect to the first power port 22 while the wire saddle 40 is clipped to the hole 142. The second power port 36 is arranged in the shell 52, and is fastened by the first snapping tab 526 and the second snapping tab 528. Fixing elements 70 are used to fix the holder 50 to the second side plate 16 by penetration through the locking holes 54 and the mounting hole 166, fixing the holder 50 to the third side plate 18 by penetration through the locking holes 54 and the mounting holes 182. The shell 52 encloses the second power port 36 with the base plate 522, the side plates 524, the second side plate 16, and the third side plate 18 to shield electromagnetic wave made from the second power port 36. Hooking the hooks 66 of the clamp 60 to the clasps 164 of the second side plate 16 to position the clamp section 62 in opposite of the second power port 36.

When the plug 34 is connected to the first power port 22, a power plug 102 can be plugged into the second power port 36 to supply power to the electronic device 1. The power plug 102 can be clipped by the clamp section 62 of the clamp 60 to avoid accidentally pulling it out from the second power port 36. When the plug 34 is pulled out from the first power port 22, the power plug 102 can be plugged into the first power port 22 to supply power to the electronic device 1. In other embodiments, a number of the second power ports 36 and holders 50 can be set in the electronic device 1.

Therefore, a user can plug the power plug 102 to the first power port 22 or the second power port 36 to supply power to the electronic device 1.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. An electronic device, comprising:
   a case;
   a power supply arranged in the case, comprising a first power port to connect to a power line for supplying power to the electronic device; and
   an extension cord comprising a plug at one end thereof and a second power port at another end, the extension cord to connect to the first power port through the plug and to connect to the power line through the second power port.

2. The electronic device as claimed in claim 1, wherein when the plug is connected with the first power port, the power line is to be connected to the second power port to supply power to the electronic device through the second power port, the extension cord, the first power port, and the power supply; when the plug is disconnected from the first power port, the power line is to be connected to the first power port to supply power to the electronic device through the first power port and the power supply.

3. The electronic device as claimed in claim 2, wherein the electronic device further comprises a holder mounted in an inner side of the case; the second power port is enclosed in a space between the case and the holder.

4. The electronic device as claimed in claim 3, wherein the holder is mounted near an opening of the case, and the second power port is exposed to an outside of the case through the opening.

5. The electronic device as claimed in claim 3, wherein the case and the holder are made of electromagnetic shielding materials.

6. The electronic device as claimed in claim 3, wherein the holder comprises a lock piece with a lock hole therein to mount to a mounting hole in the inner side of the case.

7. The electronic device as claimed in claim 3, wherein a snapping tab is arranged on an inner side of the holder to fix the second power port to the holder.

8. The electronic device as claimed in claim 1, wherein a clamp is arranged on an outer side of the case to support the power line.

9. The electronic device as claimed in claim 8, wherein the clamp comprises a clamp section to support the power line, and a hook section to fix the clamp to clasps on the outer side of the case.

10. The electronic device as claimed in claim 1, wherein the extension cord further comprises a wire saddle near the plug; the wire saddle is fixed to a hole on the case and the plug is retained in the outside of the case near the first power port.

* * * * *